(12) United States Patent
Aggarwal et al.

(10) Patent No.: US 10,755,770 B2
(45) Date of Patent: Aug. 25, 2020

(54) CIRCUIT AND METHOD FOR WRITING TO A BIT CELL

(71) Applicant: TAIWAN SEMICONDUCTOR MANUFACTURING COMPANY, LTD., Hsinchu (TW)

(72) Inventors: Pankaj Aggarwal, Zhudong Township (TW); Ching-Wei Wu, Caotun Town (TW); Jaymeen Bharatkumar Aseem, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 15/656,147

(22) Filed: Jul. 21, 2017

(65) Prior Publication Data

US 2018/0096720 A1    Apr. 5, 2018

Related U.S. Application Data

(60) Provisional application No. 62/402,975, filed on Sep. 30, 2016.

(51) Int. Cl.
*G11C 11/419* (2006.01)
*G11C 11/413* (2006.01)

(52) U.S. Cl.
CPC ......... *G11C 11/419* (2013.01); *G11C 11/413* (2013.01)

(58) Field of Classification Search
CPC ............................ G11C 11/419; G11C 11/413
USPC .......................................................... 365/156
See application file for complete search history.

(56) References Cited

U.S. PATENT DOCUMENTS

| | | | | |
|---|---|---|---|---|
| 5,267,197 A * | 11/1993 | McClure | ............... | G11C 7/1048 |
| | | | | 365/189.15 |
| 7,414,878 B1 * | 8/2008 | Christensen | ......... | G11C 7/1045 |
| | | | | 365/154 |
| 8,605,523 B2 | 12/2013 | Tao et al. | | |
| 8,630,132 B2 | 1/2014 | Cheng et al. | | |
| 8,760,948 B2 | 6/2014 | Tao et al. | | |
| 8,908,421 B2 | 12/2014 | Liaw | | |
| 8,929,160 B2 | 1/2015 | Katoch et al. | | |
| 8,964,492 B2 | 2/2015 | Hsu et al. | | |
| 8,971,133 B1 * | 3/2015 | Zheng | .................. | G11C 7/1096 |
| | | | | 365/189.05 |
| 8,982,643 B2 | 3/2015 | Lum | | |
| 9,030,893 B2 * | 5/2015 | Jung | ........................ | G11C 7/12 |
| | | | | 365/154 |
| 9,058,861 B2 * | 6/2015 | Behrends | ............... | G11C 11/419 |
| 9,117,510 B2 | 8/2015 | Yang et al. | | |
| 9,208,858 B1 | 12/2015 | Lin et al. | | |
| 9,218,872 B1 | 12/2015 | Liaw | | |

(Continued)

*Primary Examiner* — Sung Il Cho
(74) *Attorney, Agent, or Firm* — Hauptman Ham, LLP

(57) ABSTRACT

A circuit includes a bit line, a power node having a first power voltage level, a reference node having a reference voltage level, a pass gate coupled between the bit line and the power node, and a driver coupled between the bit line and the reference node. The pass gate couples the bit line to the power node responsive to a first signal, and the driver couples the bit line to the reference node responsive to a second signal. The first signal is based on the first power voltage level, and the second signal is based on a second power voltage level between the reference voltage level and the first power voltage level.

20 Claims, 3 Drawing Sheets

(56) References Cited

U.S. PATENT DOCUMENTS

| | | | |
|---|---|---|---|
| 2005/0002224 A1* | 1/2005 | Kawata | G11C 8/08 365/154 |
| 2012/0155198 A1* | 6/2012 | Hirabayashi | G11C 11/412 365/189.16 |
| 2014/0153345 A1 | 6/2014 | Kim et al. | |
| 2014/0169106 A1* | 6/2014 | Kolar | G11C 7/12 365/189.02 |
| 2014/0233330 A1 | 8/2014 | Ko et al. | |
| 2014/0269112 A1* | 9/2014 | Jung | G11C 7/12 365/189.11 |
| 2015/0063007 A1* | 3/2015 | Choi | G11C 11/419 365/154 |
| 2015/0348598 A1* | 12/2015 | Wang | G11C 11/417 365/72 |
| 2015/0371702 A1 | 12/2015 | Wu et al. | |
| 2015/0380077 A1 | 12/2015 | Wu et al. | |
| 2015/0380078 A1 | 12/2015 | Liaw | |
| 2016/0093346 A1* | 3/2016 | Hoff | H03K 3/35613 365/189.11 |
| 2016/0217848 A1* | 7/2016 | Ishizu | G11C 11/418 |
| 2016/0225438 A1* | 8/2016 | Kulkarni | G11C 5/145 |
| 2017/0053695 A1* | 2/2017 | Sonkar | G11C 11/419 |
| 2017/0092378 A1* | 3/2017 | Tanaka | G11C 29/12 |
| 2017/0110184 A1* | 4/2017 | Ngo | G11C 7/12 |
| 2017/0154673 A1* | 6/2017 | Seo | G11C 7/222 |
| 2017/0243635 A1* | 8/2017 | Sonkar | G11C 7/12 |
| 2017/0365331 A1* | 12/2017 | Chanana | G11C 11/419 |
| 2017/0372776 A1* | 12/2017 | Walker | G11C 11/412 |

\* cited by examiner

CIRCUIT AND METHOD FOR WRITING TO A BIT CELL

BACKGROUND

In some memory circuits, memory arrays operate at a power voltage level higher than a power voltage level at which other circuits operate. The higher voltage level of the memory array supports reliable functioning of memory cells while the lower voltage level of the other circuits reduces power requirements.

By enabling circuit performance features separately, circuits having multiple power domains are capable of overall circuit performance that exceeds performance levels of circuits having single power domains.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
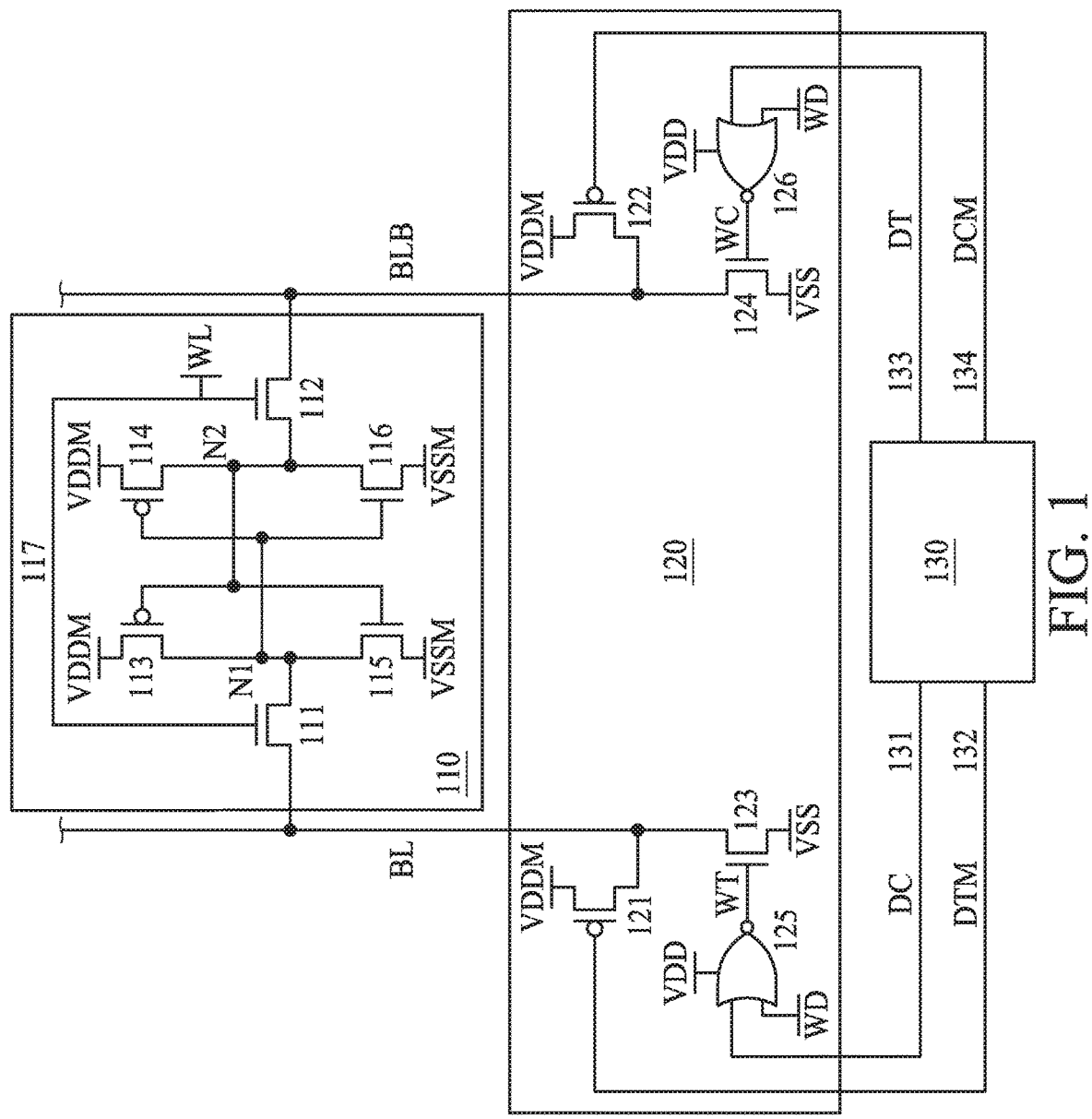
FIG. 1 is a diagram of a memory circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A memory circuit includes a bit line, a power node having a memory domain power voltage level, a reference node having a reference voltage level, a pass gate coupled between the bit line and the power node, and a driver coupled between the bit line and the reference node. The pass gate selectively couples the bit line to the power node responsive to a first signal, and the driver selectively couples the bit line to the reference node responsive to a second signal. The first signal is based on the memory domain power voltage level, and the second signal is based on a second power voltage level between the reference voltage level and the memory domain power voltage level.

FIG. 1 is a diagram of a memory circuit 100, in accordance with some embodiments. Memory circuit 100 includes a bit cell 110, a driver circuit 120, and an input circuit 130. Each of bit cell 110 and driver circuit 120 is electrically coupled to a first bit line BL and to a second bit line BLB. Signal paths 131-134 connect input circuit 130 to driver circuit 120.

Bit cell 110 is a memory bit cell of memory circuit 100. In some embodiments, bit cell 110 is one of a plurality (not shown) of bit cells and one or more bit cells (not shown) in addition to bit cell 110 are electrically coupled to first bit line BL and to second bit line BLB.

In the embodiment depicted in FIG. 1, bit cell 110 is a six-transistor bit cell configured as a memory cell of a static random access memory (SRAM) circuit. In some embodiments, bit cell 110 includes fewer than or more than six transistors. In some embodiments, bit cell 110 is configured as a memory cell other than a memory cell of an SRAM circuit.

Bit cell 110 includes bit cell pass gates 111 and 112, p-type metal-oxide-semiconductor (PMOS) transistors 113 and 114, and n-type metal-oxide-semiconductor (NMOS) transistors 115 and 116. Pass gate 111 and gate terminals of PMOS transistor 114 and NMOS transistor 115 are electrically coupled to a node N1. Pass gate 112 and gate terminals of PMOS transistor 113 and NMOS transistor 116 are electrically coupled to a node N2. Gates of pass gates 111 and 112 are electrically coupled to a word line 117.

A source terminal of each of PMOS transistors 113 and 114 is electrically coupled to a power node VDDM, and a source terminal of each of NMOS transistors 115 and 116 is electrically coupled to a reference node VSSM. Power node VDDM has a power voltage level corresponding to a memory domain and is also referred to as a memory domain power node having a memory domain power voltage level. Reference node VSSM has a reference voltage level for the memory domain that is also referred to as a memory domain reference node having a memory domain reference voltage level.

In some embodiments, power node VDDM has a memory domain voltage level, relative to the memory domain reference voltage level, of 0.7 volts (V) to 1.0 V.

By the configuration of PMOS transistors 113 and 114 and NMOS transistors 115 and 116, memory cell 100 is configured to, in operation, store one of the memory domain power voltage level or the memory domain reference voltage level at node N1 and the other of the memory domain power voltage level or the memory domain reference voltage level at node N2.

In operation, a first logical state, or value, corresponds to node N1 storing the memory domain power voltage level and node N2 storing the memory domain reference voltage level, and a second logical state, or value, corresponds to node N1 storing the memory domain reference voltage level and node N2 storing the memory domain power voltage level.

Pass gate 111 is configured to, responsive to a signal WL on word line 117, selectively electrically couple node N1 to bit line BL or electrically decouple node N1 from bit line BL. Pass gate 112 is configured to, responsive to signal WL on word line 117, selectively electrically couple node N2 to bit line BLB or electrically decouple node N2 from bit line BLB.

In some embodiments, signal WL has a first logical state corresponding to signal WL having the memory domain power voltage level (which is the same voltage level as is on memory domain power node VDDM) and a second logical state corresponding to signal WL having the memory domain reference voltage level (which is the same voltage level as is on memory domain reference node VSSM). In some embodiments, signal WL is thereby based on the memory domain power voltage level. In some embodiments, signal WL has a different scheme rather than being based on the memory domain power voltage level.

By the configuration of pass gates 111 and 112, in a read operation, bit line BL is used to determine the voltage level of node N1, and bit line BLB is used to determine the voltage level of node N2. In a read operation, a logical state, or value, of bit cell 110 is thereby determined using bit lines BL and BLB.

By the configuration of pass gates 111 and 112, in a write operation, bit line BL is used to establish a voltage level on node N1, and bit line BLB is used to establish a voltage level on node N2. In a write operation, a logical state, or value, is thereby written to bit cell 110 using bit lines BL and BLB.

Driver circuit 120 includes bit line pass gates 121 and 122, drivers 123 and 124, and logic gates 125 and 126. Pass gate 121 is coupled between memory domain power node VDDM and bit line BL, and pass gate 122 is coupled between memory domain power node VDDM and bit line BLB. Driver 123 is coupled between bit line BL and a reference node VSS, and between logic gate 125 and reference node VSS. Driver 124 is coupled between bit line BLB and reference node VSS, and between logic gate 126 and reference node VSS. Each of logic gates 125 and 126 is electrically coupled to a second power node VDD.

Second power node VDD has a second power voltage level corresponding to a domain separate from the memory domain. Reference node VSS has a second reference voltage level.

In some embodiments, second power node VDD has a second power voltage level, relative to the second reference voltage level, of 0.3 V to 0.6 V. In some embodiments, the memory domain voltage level is greater than the second power voltage level by 300-500 millivolts (mV). In some embodiments, the memory domain voltage level is greater than the second power voltage level by at least 350 mV.

In some embodiments, the second reference voltage level of reference node VSS is the memory domain reference voltage level of reference node VSSM. In some embodiments, the second reference voltage level of reference node VSS has a value different from that of the memory domain reference voltage level of reference node VSSM.

A drain terminal of pass gate 121 is electrically coupled to bit line BL, a source terminal of pass gate 121 is electrically coupled to memory domain power node VDDM, and a gate terminal of pass gate 121 is electrically coupled to signal line 132. Pass gate 121 is thereby configured to electrically couple bit line BL to memory domain power node VDDM responsive to a signal DTM on signal path 132.

In operation, signal DTM controls pass gate 121 to selectively drive bit line BL to the memory domain power voltage level. In some embodiments, signal DTM has a first logical state corresponding to signal DTM having the memory domain power voltage level and a second logical state corresponding to signal DTM having the memory domain reference voltage level. In some embodiments, signal DTM is thereby based on the memory domain power voltage level. In some embodiments, signal DTM has a different scheme rather than being based on the memory domain power voltage level.

A drain terminal of pass gate 122 is electrically coupled to bit line BLB, a source terminal of pass gate 122 is electrically coupled to memory domain power node VDDM, and a gate terminal of pass gate 122 is electrically coupled to signal line 134. Pass gate 122 is thereby configured to electrically couple bit line BLB to memory domain power node VDDM responsive to a signal DCM on signal path 134.

In operation, signal DCM controls pass gate 122 to selectively drive bit line BLB to the memory domain power voltage level. In some embodiments, signal DCM has a first logical state corresponding to signal DCM having the memory domain power voltage level and a second logical state corresponding to signal DCM having the memory domain reference voltage level. In some embodiments, signal DCM is thereby based on the memory domain power voltage level. In some embodiments, signal DCM has a different scheme rather than being based on the memory domain power voltage level. In some embodiments, signal DCM corresponds to a data complement signal for a data bit written to bit cell 110 in a write operation.

In the embodiment depicted in FIG. 1, each of pass gates 121 and 122 includes a PMOS transistor. In some embodiments, pass gate 121 includes an NMOS transistor or another suitable switching device capable of selectively coupling bit line BL to memory domain power node VDDM responsive to signal DTM. In some embodiments, pass gate 122 includes an NMOS transistor or another suitable switching device capable of selectively coupling bit line BLB to memory domain power node VDDM responsive to signal DCM.

A drain terminal of driver 123 is electrically coupled to bit line BL, a source terminal of driver 123 is electrically coupled to reference node VSS, and a gate terminal of driver 123 is electrically coupled to an output terminal of logic gate 125. Driver 123 is thereby configured to electrically couple bit line BL to reference node VSS responsive to a signal WT on the output terminal of logic gate 125.

In operation, signal WT thereby controls driver 123 to selectively drive bit line BL to the second reference voltage level. In some embodiments, signal WT has a first logical state corresponding to signal WT having the second power voltage level and a second logical state corresponding to signal WT having the second reference voltage level. In some embodiments, signal WT is thereby based on the second power voltage level. In some embodiments, signal WT has a different scheme rather being based on the second power voltage level.

A drain terminal of driver 124 is electrically coupled to bit line BLB, a source terminal of driver 124 is electrically coupled to reference node VSS, and a gate terminal of driver 124 is electrically coupled to an output terminal of logic gate 126. Driver 124 is thereby configured to electrically couple bit line BLB to reference node VSS responsive to a signal WC on the output terminal of logic gate 126.

In operation, signal WC thereby controls driver 124 to selectively drive bit line BLB to the second reference voltage level. In some embodiments, signal WC has a first logical state corresponding to signal WC having the second power voltage level and a second logical state corresponding to signal WC having the second reference voltage level. In some embodiments, signal WC is thereby based on the second power voltage level. In some embodiments, signal WC has a different scheme rather than being based on the second power voltage level. In some embodiments, signal WC corresponds to a write complement signal for a data bit written to bit cell 110 in a write operation.

In the embodiment depicted in FIG. 1, each of drivers 123 and 124 includes an NMOS transistor. In some embodiments, driver 123 includes a PMOS transistor or another suitable switching device capable of selectively coupling bit line BL to reference node VSS responsive to signal WT. In some embodiments, driver 124 includes a PMOS transistor or another suitable switching device capable of selectively coupling bit line BLB to reference node VSS responsive to signal WC.

Logic gate 125 includes a first input terminal electrically coupled to signal path 131 and a second input terminal configured to receive a signal WD generated by a circuit (not shown) separate from memory circuit 100. In some embodiments, signal WD is a write decode signal generated by a write line decoder circuit. In some embodiments, in a write operation, signal WD has a logical state indicating that bit cell 110 or another bit cell electrically coupled to bit lines BL and BLB is a target of the write operation. In some embodiments, in a write operation, signal WD has a logical state indicating that bit cell 110 or another bit cell electrically coupled to bit lines BL and BLB is a target of the write operation based on decoding a multibit memory address.

Logic gate 125 is thereby configured to generate signal WT on the output terminal having a logical state determined by the logical state of signal DC on signal line 131 and the logical state of signal WD. In operation, signals DC and WD thereby control signal WT received by driver 123 as described above.

Each of signals DC and WD is based on the second power voltage level. In some embodiments, signal WD corresponds to a write decode signal for bit cell 110 in a write operation, during which signal WD has the second reference voltage level.

Logic gate 126 includes a first input terminal electrically coupled to signal path 133 and a second input terminal configured to receive signal WD. Logic gate 126 is thereby configured to generate signal WC on the output terminal having a logical state determined by the logical state of signal DT on signal line 133 and the logical state of signal WD. In operation, signals DT and WD thereby control signal WC received by driver 124 as described above.

Signal DT is based on the second power voltage level.

In the embodiment depicted in FIG. 1, each of logic gates 125 and 126 is a NOR gate. In some embodiments, logic gate 125 includes one or more other types of logic gate suitable for generating signal WT for controlling driver 123 responsive to one or more input signals such as signals DC and WD. In some embodiments, logic gate 126 includes one or more other types of logic gate suitable for generating signal WC for controlling driver 124 responsive to one or more input signals such as signals DT and WD.

Input circuit 130 is a circuit such as circuit 200, described below with respect to FIG. 2, configured to generate signals DC, DTM, DT, and DCM on signal paths 131-134, respectively.

Input circuit 130 is configured to generate signal DTM based on signal DT and to generate signal DCM based on signal DC. In some embodiments, input circuit 130 is configured to generate signal DTM having the memory domain reference voltage level synchronized to signal DT having the second reference voltage level. In some embodiments, input circuit 130 is configured to generate signal DCM having the memory domain power voltage level synchronized to signal DC having the second power voltage level.

In some embodiments, input circuit 130 is configured to, in a write operation, generate signals DC and DTM as a complementary pair such that signals DC and DTM have logical states that differ from each other, and generate signals DT and DCM as a complementary pair such that signals DT and DCM have logical states that differ from each other.

In some embodiments, in a write operation, signals DC and DTM being a complementary pair, in combination with a logical state of signal WD corresponding to the write operation, causes bit line BL to be electrically coupled to either memory domain power node VDDM or to reference node VSS. In some embodiments, in a write operation, signals DT and DCM being a complementary pair, in combination with a logical state of signal WD corresponding to the write operation, causes bit line BLB to be electrically coupled to either memory domain power node VDDM or to reference node VSS.

In some embodiments, input circuit 130 is configured to, in a write operation, generate signals DT and DC as a complementary pair, generate signal DTM synchronized to signal DT, and generate signal DCM synchronized to signal DC.

In some embodiments, in a write operation, signals DT and DC being a complementary pair, signal DTM being synchronized to signal DT, and signal DCM being synchronized to signal DC cause either bit line BL to be electrically coupled to memory domain power node VDDM while bit line BLB is electrically coupled to reference node VSS or bit line BL to be electrically coupled to reference node VSS while bit line BLB is electrically coupled to memory domain power node VDDM.

Memory circuit 100 is thereby configured to, in a write operation, establish a first one of the memory domain power voltage level or the second reference voltage level at node N1 using bit line BL, and a second one of the memory domain power voltage level or the second reference voltage level at node N2 using bit line BLB. In a write operation, memory circuit 100 thereby writes one of two possible logical states, or values, to bit cell 110 using bit lines BL and BLB.

In a non-limiting example of a write operation, memory circuit 100 writes a logical value to bit cell 110 when signal WD has the second reference voltage level and signal WL has the memory domain power voltage level. In the write operation, signal WD having the second reference voltage level causes logic gate 125 to generate signal WT for driver 123 by inverting signal DC, and logic gate 126 to generate signal WC for driver 124 by inverting signal DT. Signals DT and DC being a complementary pair therefore causes one of bit lines BL or BLB to be driven to the memory domain power voltage level while the other of bit lines BL or BLB is driven to the second reference voltage level in the write operation.

In the write operation, signal WL having the memory domain power voltage level causes bit cell pass gate 111 to electrically couple bit line BL to node N1, and bit cell pass gate 112 to electrically couple bit line BLB to node N2. Node N1 is thereby driven to one of the memory domain power voltage level or the second reference voltage level while node N2 is driven to the other of the memory domain power voltage level or the second reference voltage level in the write operation.

If the logical value being written to bit cell 110 in the write operation causes bit line BL to drive node N1 to the memory domain power voltage level, transistor 114 is turned off, allowing node N2 to be driven to the second reference voltage level by bit line BLB. If the logical value being written to bit cell 110 in the write operation causes bit line BLB to drive node N2 to the memory domain power voltage level, transistor 113 is turned off, allowing node N1 to be driven to the second reference voltage level by bit line BL.

By the configuration of memory circuit 100, a write operation to bit cell 110 is assured of driving each of nodes N1 and N2 to a desired voltage level by ensuring that the relevant one of transistor 113 or transistor 114 is turned off during the write operation. Because the relevant transistor is turned off during a write operation, a desired logical value is assured of being written to bit cell 110 in a write operation in which a transition in signal WL precedes a transition in signal WT or WC. In a write operation in which the relevant transistor is not turned off by being driven to the memory domain power voltage level, if the relevant driver is unable to drive the node coupled to the source of the transistor to the second reference voltage level, a write failure can occur.

By driving one of bit lines BL or BLB to the memory domain power voltage level and the other of bit lines BL or BLB to the second reference voltage level during a write operation, a dummy read operation is not needed to clear bit lines BL and BLB prior to the write operation.

Compared to other approaches in which neither bit line BL nor bit line BLB is selectively coupled to memory domain power node VDDM, memory circuit 100 is configured to avoid write failures and dummy read operations. Compared to other approaches in which bit lines BL and BLB are driven using cross-latched PMOS transistors or NMOS drivers with increased drive capabilities, memory circuit 100 also has a smaller area and lower overall leakage.

In some embodiments, memory circuit 100 has a configuration that includes one or more pass gates, drivers, logic gates, and/or signals other than those of the embodiment depicted in FIG. 1 such that, in a write operation, one of bit lines BL or BLB is otherwise driven to the memory domain power voltage level while the other of bit lines BL or BLB is driven to the second reference voltage level, thereby obtaining the benefits described above with respect to the embodiment depicted in FIG. 1.

Input circuit 130 is configured so that, in one or more operations outside of write operations, as described above, input circuit 130 generates each of signals DT and DC having the second power voltage level while each of signals DTM and DCM has the memory domain power voltage level. Memory circuit 100 is thereby configured so that bit line BL is electrically decoupled from memory domain power node VDDM by pass gate 121 and from reference node VSS by driver 123 while bit line BLB is electrically decoupled from memory domain power node VDDM by pass gate 122 and from reference node VSS by driver 124 during the one or more operations outside of write operations.

By being electrically decoupled from memory domain power node VDDM and reference node VSS during the one or more operations outside of the write operations, each of bit lines BL and BLB is capable of being electrically coupled to second power node VDD by one or more circuits (not shown), thereby being driven, or pre-charged, to the second power voltage level. In some embodiments, the one or more operations outside of write operations include a read operation or an idle or sleep state.

Figure 2:
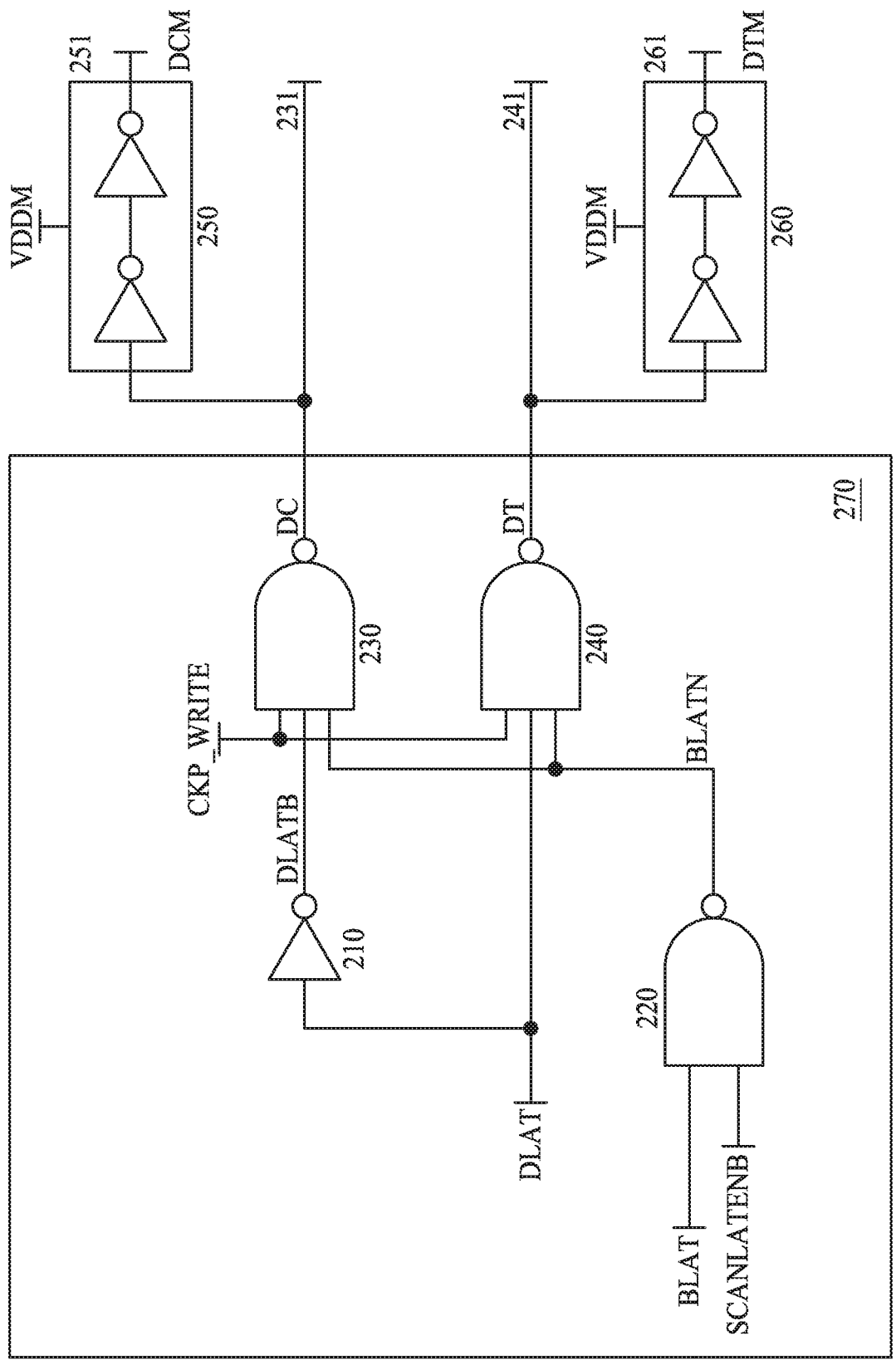
FIG. 2 is a diagram of an input circuit, in accordance with some embodiments.

FIG. 2 is a diagram of an input circuit 200, in accordance with some embodiments. Input circuit 200 is usable as input circuit 130, described above with respect to memory circuit 100 and FIG. 1. Input circuit 200 includes an inverter 210, NAND gates 220-240, and conversion circuits 250 and 260. Each of inverter 210 and NAND gates 220-240 is configured to operate in a power domain 270 having the second power voltage level described above with respect to memory circuit 100 and FIG. 1. Input circuit 200 is configured to receive signals DLAT, BLAT, SCANLATENB, and CKP_WRITE from one or more circuits (not shown) external to input circuit 200, and to generate signals DC, DCM, DT, and DTM based on signals DLAT, BLAT, SCANLATENB, and CKP_WRITE.

Inverter 210 is configured to receive signal DLAT from an external source (not shown) at the input terminal and output a signal DLATB at the output terminal. In operation, inverter 210 inverts signal DLAT to generate signal DLATB.

NAND gate 220 is configured to receive signal BLAT from an external source (not shown) at a first input terminal and signal SCANLATENB from an external source (not shown) at a second input terminal, and to output a signal BLATN on the output terminal. In operation, NAND gate 220 performs a NAND operation on signals BLAT and SCANLATENB to generate signal BLATN.

NAND gate 230 is configured to receive signal DLATB at a first input terminal, signal BLATN at a second input terminal, and signal CKP_WRITE from an external source (not shown) at a third input terminal, and to output signal DC on signal line 231. In operation, NAND gate 230 performs a NAND operation on signals DLATB, BLATN, and CKP_WRITE to generate signal DC.

NAND gate 240 is configured to receive signal DLAT at a first input terminal, signal BLATN at a second input terminal, and signal CKP_WRITE at a third input terminal, and to output signal DT on signal line 241. In operation, NAND gate 240 performs a NAND operation on signals DLAT, BLATN, and CKP_WRITE to generate signal DT.

Because each of inverter 210 and NAND gates 220-240 is configured to operate in power domain 270, each of signals DLAT, BLAT, SCANLATENB, DLATB, BLATN, CKP_WRITE, DC, and DT is based on the second power voltage level.

Conversion circuit 250 is configured to receive signal DC on signal line 231 and generate signal DCM on signal line 251. Conversion circuit 250 is electrically coupled to memory domain power node VDDM and configured to generate signal DCM based on the memory domain power voltage level.

Conversion circuit 250 is configured to generate signal DCM synchronized to signal DC. In some embodiments, signal DCM being synchronized to signal DC includes signal DCM having a delay introduced by conversion circuit 250, wherein the delay is insignificant relative to timing of operations of memory circuit 100.

Conversion circuit 250 is configured to generate signal DCM based on the memory domain power voltage level. In some embodiments, conversion circuit 250 is configured to generate signal DCM by shifting a voltage level input by signal DC from the second power voltage level to the memory domain power voltage level.

In the embodiment depicted in FIG. 2, conversion circuit 250 includes two inverters (not labeled) configured to generate signal DCM based on the memory domain power voltage level and synchronized to signal DC. In some embodiments, conversion circuit 250 includes one or more other circuit elements suitable for generating signal DCM based on the memory domain power voltage level and synchronized to signal DC.

Conversion circuit 260 is configured to receive signal DT on signal line 241 and generate signal DTM on signal line 261. Conversion circuit 260 is electrically coupled to memory domain power node VDDM and configured to generate signal DTM based on the memory domain power voltage level.

Conversion circuit 260 is configured to generate signal DTM synchronized to signal DT. In some embodiments, signal DTM being synchronized to signal DT includes signal DTM having a delay introduced by conversion circuit 260, wherein the delay is insignificant relative to timing of operations of memory circuit 100.

Conversion circuit 260 is configured to generate signal DTM based on the memory domain power voltage level. In some embodiments, conversion circuit 260 is configured to generate signal DTM by shifting a voltage level input by signal DT from the second power voltage level to the memory domain power voltage level.

In the embodiment depicted in FIG. 2, conversion circuit 260 includes two inverters (not labeled) configured to generate signal DTM based on the memory domain power voltage level and synchronized to signal DT. In some embodiments, conversion circuit 260 includes one or more other circuit elements suitable for generating signal DTM based on the memory domain power voltage level and synchronized to signal DT.

By the configuration of input circuit 200, NAND gate 230 is configured to generate signal DC as an inverted version of signal DLATB, as enabled by signals BLATN and CKP_WRITE. By the configuration of input circuit 200, NAND gate 240 is configured to generate signal DT as a non-inverted version of signal DLAT, as enabled by signals BLATN and CKP_WRITE.

Input circuit 200 is therefore configured to generate signals DC and DT as a complementary pair. Because signal DCM is synchronized to signal DC, and signal DTM is synchronized to signal DT, input circuit 200 is configured to generate signals DCM and DTM as a complementary pair.

In a write operation, signals BLAT, SCANLAT ENB, and CKP_WRITE thereby enable generation of signals DC, DCM, DT, and DTM usable in circuit 100, as described above with respect to FIG. 1.

In one or more operations outside of write operations, as described above with respect to memory circuit 100 and FIG. 1, signal CKP_WRITE having the second reference voltage level causes each of signals DC and DT to have the second power voltage level, and each of signals DCM and DTM to have the memory domain power voltage level.

Input circuit 200 is thereby configured to be usable as input circuit 130 of memory circuit 100 such that the benefits described above with respect to memory circuit 100 and FIG. 1 are obtainable.

Figure 3:
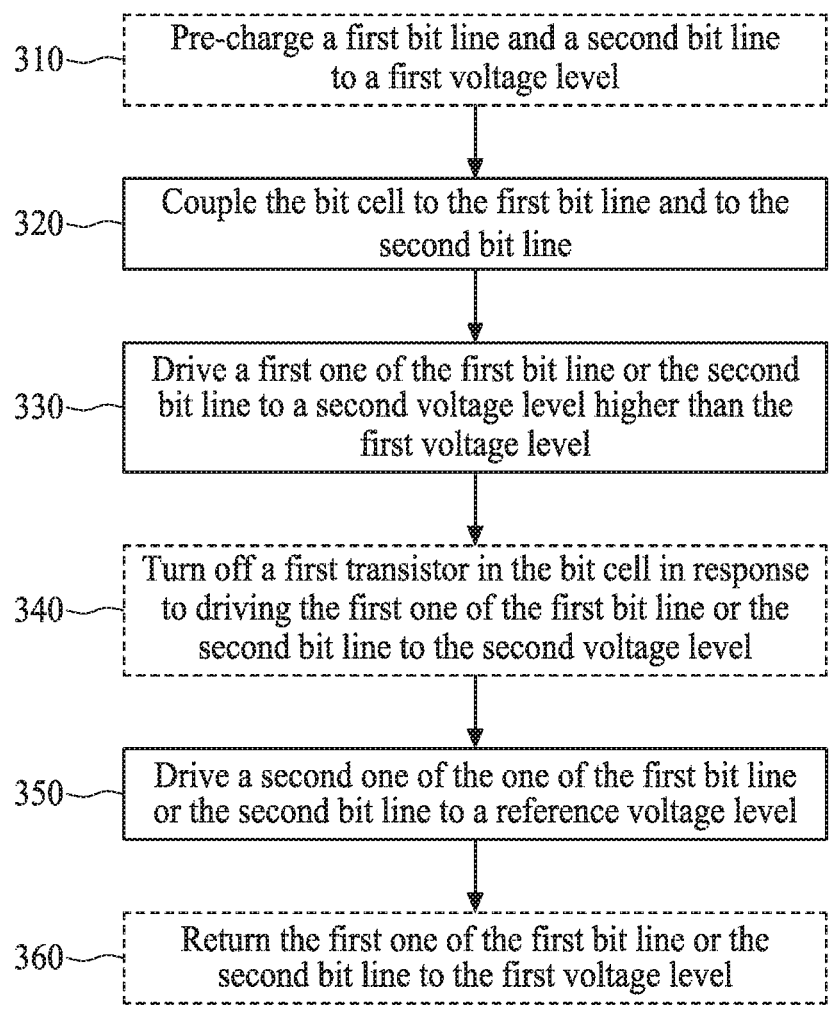
FIG. 3 is a flowchart of a method of writing to a bit cell, in accordance with some embodiments.

FIG. 3 is a flowchart of a method 300 of writing to a bit cell, in accordance with one or more embodiments. In some embodiments, method 300 is implemented to write to a bit cell of an SRAM. In some embodiments, method 300 is implemented to write to bit cell 110 of memory circuit 100, described above with respect to FIG. 1.

In some embodiments, operations in addition to those depicted in FIG. 3 are performed before, between, and/or after the operations depicted in FIG. 3. In some embodiments, the operations depicted in FIG. 3 are performed in an order other than the order depicted in FIG. 3.

At operation 310, in some embodiments, a first bit line and a second bit line are driven to a first voltage level. The first voltage level corresponds to a domain of a memory circuit outside of a memory domain. In some embodiments, the first bit line is bit line BL, the second bit line is bit line BLB, and driving first bit line and the second bit line to the first voltage level includes driving bit lines BL and BLB to the second power voltage level on second power node VDD, described above with respect to memory circuit 100 and FIG. 1.

At operation 320, the bit cell is coupled to the first bit line and to the second bit line. The first bit line and the second bit line have the first voltage level. In some embodiments, coupling the bit cell to the first bit line and to the second bit line includes using one or more bit cell pass gates. In some embodiments, coupling the bit cell to the first bit line and to the second bit line includes coupling bit cell 110 to bit line BL using bit cell pass gate 111 and coupling bit cell 110 to bit line BLB using bit cell pass gate 112, described above with respect to memory circuit 100 and FIG. 1.

In some embodiments, coupling the bit cell to the first bit line and to the second bit line includes selectively coupling the bit cell to one or both of the first bit line or the second bit line in response to a signal based on a memory domain power voltage level. In some embodiments, coupling the bit cell to the first bit line and to the second bit line includes coupling bit cell 110 to bit lines BL and BLB in response to signal WL based on the memory domain power voltage level on memory domain power node VDDM, described above with respect to memory circuit 100 and FIG. 1.

At operation 330, a first one of the first bit line or the second bit line is driven to a second voltage level higher than the first voltage level. Driving the first one of the first bit line or the second bit line to the second voltage level includes driving the first one of the first bit line or the second bit line to an operating voltage of the bit cell. In some embodiments, driving the first one of the first bit line or the second bit line to the second voltage level includes driving the first one of the first bit line or the second bit line to the memory domain power voltage level on memory domain power node VDDM, described above with respect to memory circuit 100 and FIG. 1.

In some embodiments, driving the first one of the first bit line or the second bit line to the second voltage level includes controlling a bit line pass gate to electrically couple the first one of the first bit line or the second bit line to a power node having the second voltage. In some embodiments, driving the first one of the first bit line or the second bit line to the second voltage level includes controlling one of bit line pass gates 121 or 122 to electrically couple one of bit lines BL or BLB to memory domain power node VDDM having the memory domain power voltage level, described above with respect to memory circuit 100 and FIG. 1.

In some embodiments, driving the first one of the first bit line or the second bit line to the second voltage level includes controlling a bit line pass gate with a signal based on the second voltage level. In some embodiments, driving the first one of the first bit line or the second bit line to the second voltage level includes controlling one of bit line pass gates 121 or 122 with one of signals DTM or DCM, described above with respect to memory circuit 100 and FIG. 1.

In some embodiments, driving the first one of the first bit line or the second bit line to the second voltage level includes controlling a bit line pass gate with a signal having a transition that lags a transition in a signal controlling pass gates in the bit cell. In some embodiments, driving the first one of the first bit line or the second bit line to the second voltage level includes controlling one of pass gates 121 or 122 with one of signals WT or WC having a transition that lags a transition in a signal WL, described above with respect to memory circuit 100 and FIG. 1.

In some embodiments, driving the first one of the first bit line or the second bit line to the second voltage level includes generating the signal based on the second voltage level from a signal based on the first voltage level. In some embodiments, driving the first one of the first bit line or the second bit line to the second voltage level includes generating one of signals DCM or DTM based on the memory domain power voltage level from a corresponding one of signals DC or DT based on the second power voltage level, described above with respect to input circuit 200 and FIG. 2.

At operation 340, in some embodiments, a bit cell transistor is turned off in response to driving the first one of the first bit line or the second bit line to the second voltage level. In some embodiments, turning off a bit cell transistor in response to driving the first one of the first bit line or the second bit line to the second voltage level includes turning off a PMOS transistor of an SRAM bit cell.

In some embodiments, turning off a bit cell transistor in response to driving the first one of the first bit line or the second bit line to the second voltage level includes turning off one of transistors 113 or 114 of bit cell 110, described above with respect to memory circuit 100 and FIG. 1.

At operation 350, a second one of the first bit line or the second bit line is driven to a reference voltage level lower than the first voltage level. Driving the second one of the first bit line or the second bit line to the reference voltage level includes driving the second one of the first bit line or the second bit line to a reference voltage level of the domain of the memory circuit outside of the memory domain. In some embodiments, the reference voltage level of the domain of the memory circuit outside of the memory domain is the same as a reference voltage level of the memory domain.

In some embodiments, driving the second one of the first bit line or the second bit line to the reference voltage level includes driving one of bit lines BL or BLB to the second reference voltage level on reference node VSS, described above with respect to memory circuit 100 and FIG. 1.

In some embodiments, driving the second one of the first bit line or the second bit line to the reference voltage level includes controlling a driver to electrically couple the second one of the first bit line or the second bit line to a reference node having the reference voltage. In some embodiments, driving the second one of the first bit line or the second bit line to the reference voltage level includes controlling one of drivers 123 or 124 to electrically couple one of bit lines BL or BLB to reference node VSS having the second reference voltage level, described above with respect to memory circuit 100 and FIG. 1.

In some embodiments, driving the second one of the first bit line or the second bit line to the reference voltage level includes controlling a driver with a signal based on the first voltage level. In some embodiments, driving the second one of the first bit line or the second bit line to the reference voltage level includes controlling one of drivers 123 or 124 with one of signals WT or WC, described above with respect to memory circuit 100 and FIG. 1.

At operation 360, in some embodiments, the first bit line and the second bit line are returned to the first voltage level. In some embodiments, returning the first bit line and the second bit line to the first voltage level includes controlling pass gates to decouple the first bit line and the second bit line from a power node having the second voltage level. In some embodiments, returning the first bit line and the second bit line to the first voltage level includes controlling drivers to decouple the first bit line and the second bit line from a reference node having the reference voltage level.

In some embodiments, returning the first bit line and the second bit line to the first voltage level includes controlling pass gates 121 and 122 to decouple bit lines BL and BLB from memory domain power node VDDM having the memory domain power voltage level, described above with respect to memory circuit 100 and FIG. 1. In some embodiments, returning the first bit line and the second bit line to the first voltage level includes controlling drivers 123 and 124 to decouple bit lines BL and BLB from reference node VSS having the second reference voltage level, described above with respect to memory circuit 100 and FIG. 1.

In some embodiments, returning the first bit line and the second bit line to the first voltage level includes controlling pass gates and drivers based on a signal corresponding to operations outside of write operations. In some embodiments, returning the first bit line and the second bit line to the first voltage level includes controlling pass gates 121 and 122 and drivers 123 and 124 based on signal CKP_WRITE, described above with respect to memory circuit 100 and FIG. 1, and input circuit 200 and FIG. 2.

By driving a first one of a first bit line or a second bit line to a second voltage level higher than a first voltage level, and driving a second one of the first bit line or the second bit line to a reference voltage level, method 300 ensures that a desired logical value is written to a bit cell. Method 300 thereby provides improved reliability and less leakage compared to approaches in which a bit line is not driven to a second voltage level higher than a first voltage level, as described above with respect to memory circuit 100.

In some embodiments, a circuit comprises a bit line, a power node having a first power voltage level, a reference node having a reference voltage level, a pass gate coupled between the bit line and the power node, and a driver coupled between the bit line and the reference node. The pass gate is configured to couple the bit line to the power node responsive to a first signal, the first signal being based on the first power voltage level, and the driver is configured to couple the bit line to the reference node responsive to a second signal, the second signal being based on a second power voltage level between the reference voltage level and the first power voltage level.

In some embodiments, a memory circuit comprises a reference node having a reference voltage level, a memory domain power node having a memory domain power voltage level, a first bit line, a second bit line, and a bit cell. The bit cell comprises a first bit cell pass gate configured to selectively couple the bit cell to the first bit line and a second bit cell pass gate configured to selectively couple the bit cell to the second bit line. A driver circuit comprises a first bit line pass gate, a second bit line pass gate, a first driver, and a second driver. The bit cell is configured to operate at the memory domain power level, the first bit line pass gate is configured to selectively couple the first bit line to the memory domain power node, the second bit line pass gate is configured to selectively couple the second bit line to the memory domain power node, the first driver is configured to selectively couple the first bit line to the reference node, and the second driver is configured to selectively couple the second bit line to the reference node.

In some embodiments, method of writing to a bit cell comprises coupling the bit cell to a first bit line and to a second bit line, the first bit line and the second bit line having a first voltage level, driving a first one of the first bit line or the second bit line to a second voltage level higher than the first voltage level, the second voltage level corresponding to an operating voltage of the bit cell, and driving a second one of the first bit line or the second bit line to a reference voltage level lower than the first voltage level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A circuit comprising:
a first bit line;
a power node having a first power voltage level;
a reference node having a reference voltage level;
a first pass gate coupled between the first bit line and the power node;
a first driver coupled between the first bit line and the reference node;
a first conversion circuit configured to receive a first signal on a first signal line and convert the first signal into a second signal;
a second conversion circuit configured to receive a third signal on a second signal line and convert the third signal into a fourth signal, the first and third signals being configured as a complementary pair during a write operation; and
a first logic gate configured to receive the third signal on the second signal line and convert the third signal into a fifth signal responsive to a control signal and the third signal;
wherein:
the first power voltage level represents a maximum of each of the second and fourth signals;
an intermediate power voltage level, between the reference voltage level and the first power voltage level, represents a maximum of each of the first, third, and fifth signals;
the first pass gate is configured to couple the first bit line to the power node responsive to the second signal and independent of the control signal; and
the first driver is configured to couple the first bit line to the reference node responsive to the fifth signal.

2. The circuit of claim 1, further comprising:
a NAND gate configured to generate the first signal based on three input signals.

3. The circuit of claim 1, wherein:
the first power voltage level is a power voltage level of a memory domain of a memory circuit.

4. The circuit of claim 1, further comprising:
a second bit line;
a second pass gate coupled between the second bit line and the power node;
a second driver coupled between the second bit line and the reference node; and a second logic gate configured to receive the first signal on the first signal line and convert the first signal into a sixth signal, the intermediate power voltage level representing a maximum of the sixth signal;
wherein:
the second pass gate is configured to couple the second bit line to the power
node responsive to the fourth signal; and
the second driver is configured to couple the second bit line to the reference node responsive to the sixth signal.

5. The circuit of claim 4, wherein:
outside of the write operation, each of the first and third signals is configured to have a first logical state;
the first pass gate is configured to decouple the first bit line from the power node based on the second signal having the first logical state; and
the second pass gate is configured to decouple the second bit line from the power node based on the fourth signal having the first logical state.

6. The circuit of claim 4, wherein:
the second logic gate is configured to convert the first signal into the sixth signal responsive to the control signal; and
the control signal is based on the intermediate power voltage level.

7. The circuit of claim 6, wherein:
the first conversion circuit comprises a first inverter configured to receive the first signal and coupled to a second inverter configured to output the second signal; and
the second conversion circuit comprises a third inverter configured to receive the third signal and coupled to a fourth inverter configured to output the fourth signal.

8. The circuit of claim 6, wherein:
the first logic gate comprises a first NOR gate configured to generate the fifth signal based on the third and control signals; and
the second logic gate comprises a second NOR gate configured to generate the sixth signal based on the first and control signals.

9. The circuit of claim 1, wherein:
the first conversion circuit is configured to generate the second signal having the first power voltage level synchronized to the first signal having the intermediate power voltage level; and
the second conversion circuit is configured to generate the fourth signal having the first power voltage level synchronized to the third signal having the intermediate power voltage level.

10. A memory circuit comprising:
a reference node having a reference voltage level;
a memory domain power node having a memory domain power voltage level;
an intermediate power node having an intermediate power voltage level between the reference voltage level and the memory domain power voltage level;
a first bit line;
a second bit line;
a bit cell including:
a first bit cell pass gate configured to selectively couple the bit cell to the first bit line; and
a second bit cell pass gate configured to selectively couple the bit cell to the second bit line; and
a driver circuit comprising a first bit line pass gate, a second bit line pass gate, a first driver, and a second driver;

first and second conversion circuits configured to convert first and second signals into respective third and fourth signals;

wherein:

the bit cell is configured to operate at the memory domain power voltage level;

the first conversion circuit is configured to generate the third signal having the memory domain power voltage level synchronized to the first signal having the intermediate power voltage level;

the second conversion circuit is configured to generate the fourth signal having the memory domain power voltage level synchronized to the second signal having the intermediate power voltage level;

the first bit line pass gate is configured to selectively couple the first bit line to the memory domain power node according to the third signal and independent of a control signal;

the second bit line pass gate is configured to selectively couple the second bit line to the memory domain power node according to the fourth signal and independent of the control signal;

the first driver is configured to selectively couple the first bit line to the reference node according to the second signal and the control signal; and the second driver is configured to selectively couple the second bit line to the reference node according to the first signal and the control signal.

11. The memory circuit of claim 10, further comprising:

a signal generator configured to:

during an operation to write a first logical value to the bit cell, control the first bit line pass gate to couple the first bit line to the memory domain power node and control the second driver to couple the second bit line to the reference node; and during an operation to write a second logical value to the bit cell, control the second bit line pass gate to couple the second bit line to the memory domain power node and control the first driver to couple the first bit line to the reference node;

wherein the second logical value is different from the first logical value.

12. The memory circuit of claim 11, wherein:

the signal generator is further configured to, outside of the operation to write the first logical value and outside of the operation to write the second logical value, control the first bit line pass gate to decouple the first bit line from the memory domain power node and control the second bit cell pass gate to decouple the second bit line from the memory domain power node.

13. The circuit of claim 10, wherein:

the first conversion circuit comprises a first inverter configured to receive the first signal and coupled to a second inverter configured to output the third signal; and the second conversion circuit comprises a third inverter configured to receive the second signal and coupled to a fourth inverter configured to output the fourth signal.

14. A method of writing to a bit cell, the method comprising:

coupling the bit cell to a first bit line and to a second bit line, the first bit line and the second bit line having a first voltage level;

generating a first signal for which a maximum is a second voltage level higher than the first voltage level, the second voltage level corresponding to an operating voltage of the bit cell, the generating the first signal including:

receiving, at a first conversion circuit, a second signal on a first signal line; and passing the second signal, for which a maximum is the first voltage level, though a first voltage-shifting data signal path of the first conversion circuit, wherein the first signal has the second voltage level synchronized to the second signal having the first voltage level;

receiving, at a first logic gate, the second signal on the first signal line;

generating a third signal, for which a maximum is the first voltage level, by passing the second signal through the first logic gate responsive to a control signal;

driving a first one of the first bit line or the second bit line to the second voltage level according to the first signal and independent of the control signal; and driving a second one of the first bit line or the second bit line to a reference voltage level lower than the first voltage level according to the third signal.

15. The method of claim 14, wherein the driving the first one of the first bit line or the second bit line to the second voltage level includes:

controlling a p-type metal-oxide-semiconductor (PMOS) transistor with the first signal.

16. The method of claim 15, wherein the driving the second one of the first bit line or the second bit line to the reference voltage level includes:

controlling an n-type metal-oxide-semiconductor (NMOS) transistor with the third signal.

17. The method of claim 14, further comprising:

pre-charging the first bit line and the second bit line to the first voltage level; and returning the first bit line and the second bit line to the first voltage level.

18. The method of claim 17, wherein the returning the first bit line and the second bit line to the first voltage level includes:

decoupling the first bit line and the second bit line from a power node having the second voltage level.

19. The method of claim 14, further comprising:

turning off a bit cell transistor in response to driving the first one of the first bit line or the second bit line to the second voltage level.

20. The method of claim 14, wherein:

the driving the first one of the first bit line or the second bit line to the second voltage level according to the first signal includes:

controlling a first p-type metal-oxide-semiconductor (PMOS) transistor with the first signal; and the method further comprises:

generating a fourth signal for which a maximum is the second voltage level, the generating the fourth signal including:

passing a fifth signal, for which a maximum is the first voltage level, though a second voltage-shifting data signal path of a second conversion circuit; and controlling a second PMOS transistor with the fourth signal.

* * * * *